United States Patent
Takabe et al.

(10) Patent No.: US 9,925,770 B2
(45) Date of Patent: Mar. 27, 2018

(54) WIRING SUBSTRATE, MEMS DEVICE, LIQUID EJECTING HEAD, AND LIQUID EJECTING APPARATUS

(71) Applicant: SEIKO EPSON CORPORATION, Tokyo (JP)

(72) Inventors: Motoki Takabe, Shiojiri (JP); Shuichi Tanaka, Chino (JP); Yasuyuki Matsumoto, Azumino (JP); Koji Asada, Azumino (JP); Eiju Hirai, Azumino (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 15/422,151

(22) Filed: Feb. 1, 2017

(65) Prior Publication Data

US 2017/0217177 A1    Aug. 3, 2017

(30) Foreign Application Priority Data

Feb. 2, 2016 (JP) ................................ 2016-017714

(51) Int. Cl.
B41J 2/14    (2006.01)
B41J 2/045   (2006.01)

(52) U.S. Cl.
CPC ....... B41J 2/14201 (2013.01); B41J 2/04521 (2013.01); B41J 2/14072 (2013.01); *B41J 2002/14491* (2013.01)

(58) Field of Classification Search
CPC .......... B41J 2/14072; B41J 2002/14491; B41J 2/04521; B41J 2/04548
See application file for complete search history.

(56) References Cited

U.S. PATENT DOCUMENTS

| | | | |
|---|---|---|---|
| 2004/0134682 A1* | 7/2004 | En ....................... | C23C 18/1607 174/258 |
| 2005/0263869 A1 | 12/2005 | Tanaka et al. | |
| 2006/0209139 A1* | 9/2006 | Murata ................ | B41J 2/14233 347/71 |
| 2009/0283914 A1 | 11/2009 | Murayama | |
| 2011/0089571 A1 | 4/2011 | Matsuo | |
| 2013/0020722 A1 | 1/2013 | Matsuo | |
| 2014/0103541 A1 | 4/2014 | Matsuo | |
| 2015/0108614 A1 | 4/2015 | Matsuo | |
| 2016/0133570 A1 | 5/2016 | Matsuo | |
| 2016/0276257 A1 | 9/2016 | Kuramochi et al. | |

FOREIGN PATENT DOCUMENTS

| | | |
|---|---|---|
| EP | 3073523 | 9/2016 |
| JP | 2000-052550 | 2/2000 |
| JP | 2001-044197 | 2/2001 |
| JP | 2004-281980 | 10/2004 |
| JP | 2005-340389 | 12/2005 |
| JP | 2007-067335 | 3/2007 |
| JP | 2009-277895 | 11/2009 |
| JP | 2011-086773 | 4/2011 |
| JP | 2012-221975 | 11/2012 |
| JP | 2015-103586 | 6/2015 |

* cited by examiner

*Primary Examiner* — Geoffrey Mruk
(74) *Attorney, Agent, or Firm* — Workman Nydegger

(57) ABSTRACT

A wiring substrate is provided with a surface wiring on at least one surface, a through hole which passes through the wiring substrate, and a through wiring which is formed in the through hole and is connected to a surface wiring, in which an inner surface of the through hole is a rough surface, and electric resistance of the through wiring is equal to or less than the electric resistance of the surface wiring.

20 Claims, 10 Drawing Sheets

WIRING SUBSTRATE, MEMS DEVICE, LIQUID EJECTING HEAD, AND LIQUID EJECTING APPARATUS

The entire disclosure of Japanese Patent Application No: 2016-017714, filed Feb. 2, 2016 is expressly incorporated by reference herein in its entirety.

BACKGROUND

1. Technical Field

The present invention relates to a wiring substrate including a through wiring passing through a substrate, a MEMS device including the wiring substrate, a liquid ejecting head including the wiring substrate, and a liquid ejecting apparatus which is provided with the liquid ejecting head.

2. Related Art

A micro electro mechanical system (MEMS) device which is a representative of a liquid ejecting head is provided with a wiring substrate on which a surface wiring is connected to a through wiring provided in a through hole. As such a wiring substrate, a wiring substrate on which a through hole is formed on a substrate, and a through wiring is formed in the through hole has been proposed (for example, refer to JP-A-2000-52550).

However, there is a difference of a linear expansion coefficient between the through wiring and the wiring substrate, and thus the through wiring may be deviated from the through hole due to a temperature change. There is a concern that due to the deviation of the through wiring, the surface wiring may be disconnected.

In addition, in the wiring substrate used in a MEMS sensor such as an ultrasonic sensor which is an example of the MEMS device, the through wiring becomes a part of the wiring through which a minute current generated by driving of a piezoelectric element flows. In such a wiring substrate, if the loss resistance of the through wiring is large, there is a concern that it becomes difficult to detect a minute current.

SUMMARY

An advantage of some aspects of the invention is to provide a wiring substrate which prevents a through wiring from being deviated, and prevents resistance of the through wiring from being increased, a MEMS device, a liquid ejecting head, and a liquid ejecting apparatus.

According to this aspect of the invention, there is provided a wiring substrate including: a surface wiring on at least one side surface; a through hole which passes through the wiring substrate; and a through wiring which is formed in the through hole, and is connected to the surface wiring, in which an inner surface of the through hole is a rough surface, and electric resistance of the through wiring is equal to or less than the electric resistance of the surface wiring.

According to the aspect, it is possible to prevent the through wiring from being deviated from the through hole due to a rough surface. With this, the surface wiring is prevented from being disconnected due to the deviation of the through wiring, and thus the reliability of the wiring substrate is improved. Further, the electric resistance of the through wiring can be set to be equal to or less than the electric resistance of the surface wiring, and thereby it is possible to suppress the loss resistance in the through wiring.

It is preferable that the inner surface of the through hole be the rough surface having an average surface roughness Ra in a range of 0.1 μm to 5.0 μm. According to this, it is possible to further prevent the through wiring from being deviated from the through hole.

In addition, it is preferable that the through hole be provided with an enlarged diameter portion in which an opening is enlarged on at least one surface side of the wiring substrate, and the through wiring include an enlarged width portion which is provided in the enlarged diameter portion. According to this, it is possible to regulate shrinking deformation of the through wiring by the enlarged width portion, and thus it is possible to further prevent the through wiring from being deviated from the through hole.

Further, it is preferable that the through hole be provided with an enlarged diameter portion which is enlarged in an intermediate part, and the through wiring include an enlarged width portion which is provided in the enlarged diameter portion. According to this, it is possible to regulate shrinking or extending deformation of the through wiring by the enlarged width portion, and thus it is possible to further prevent the through wiring from being deviated from the through hole.

In addition, it is preferable that the through hole be formed such that an aperture on the intermediate part is narrower than an aperture of the opening side. According to this, it is possible to regulate shrinking or extending deformation of the through wiring by the enlarged width portion, and thus it is possible to further prevent the through wiring from being deviated from the through hole.

Further, according to another aspect of the invention, there is provided a MEMS device which is provided with the wiring substrate described in the above-described aspect. According to this aspect, it is possible to detect a minute current flowing the wiring on the wiring substrate. Further, the disconnection of the surface wiring provided on the wiring substrate is suppressed, and thus the reliability of the MEMS device is improved.

In addition, according to still another aspect of the invention, there is provided a liquid ejecting head which is provided with the wiring substrate described in the above-described aspect. According to this aspect, it is possible to more reliably transfer a signal transferred to the liquid ejecting head via the surface wiring or the through wiring of the wiring substrate, and thus it is possible to improve the reliability of liquid ejection by the liquid ejecting head.

Further, according to still another aspect of the invention, there is provided a liquid ejecting apparatus which is provided with the liquid ejecting head described in the above-described aspect. According to this aspect, a liquid ejecting apparatus with improved reliability is provided.

BRIEF DESCRIPTION OF THE DRAWINGS

The invention will be described with reference to the accompanying drawings, wherein like numbers reference like elements.

DESCRIPTION OF EXEMPLARY EMBODIMENTS

Embodiment 1

The invention will be specifically described based on embodiments. In the present embodiment, an ink jet type recording head (hereinafter, referred to as a recording head) which ejects ink will be described as an example of a liquid ejecting head.

Figure 1:
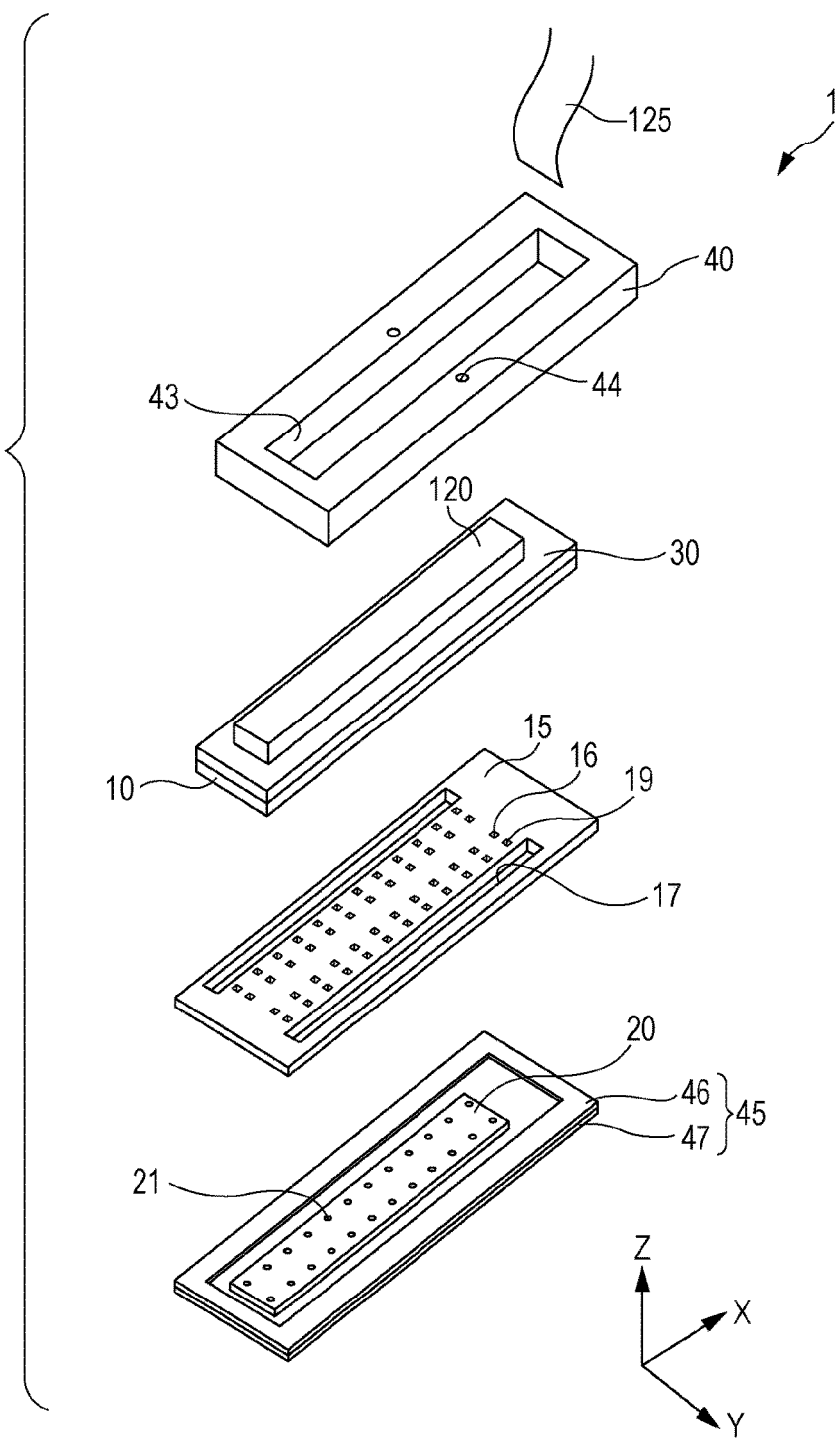
FIG. 1 is an exploded perspective view of a recording head.
Figure 2:
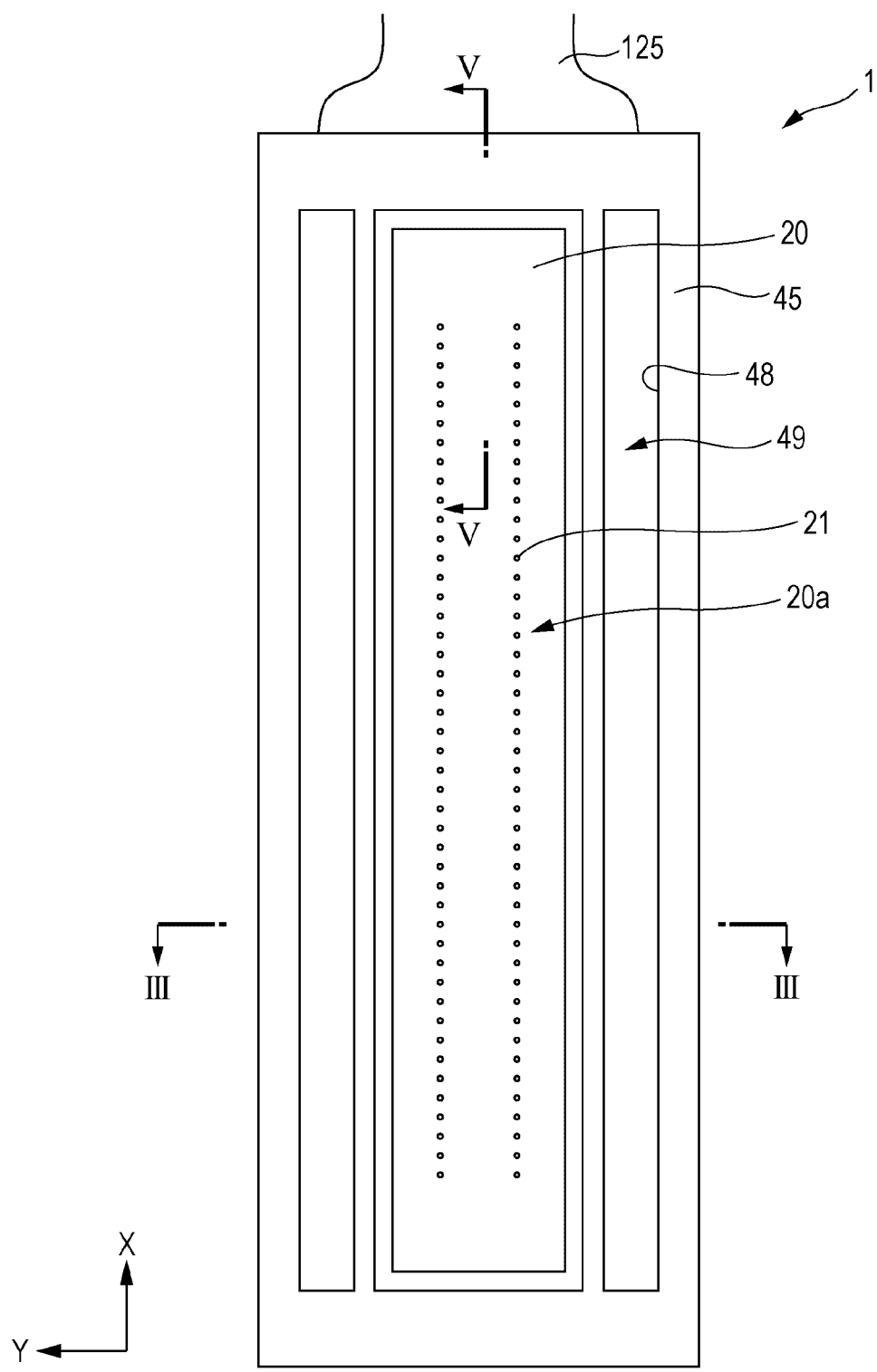
FIG. 2 is a plan view of the recording head.
Figure 3:
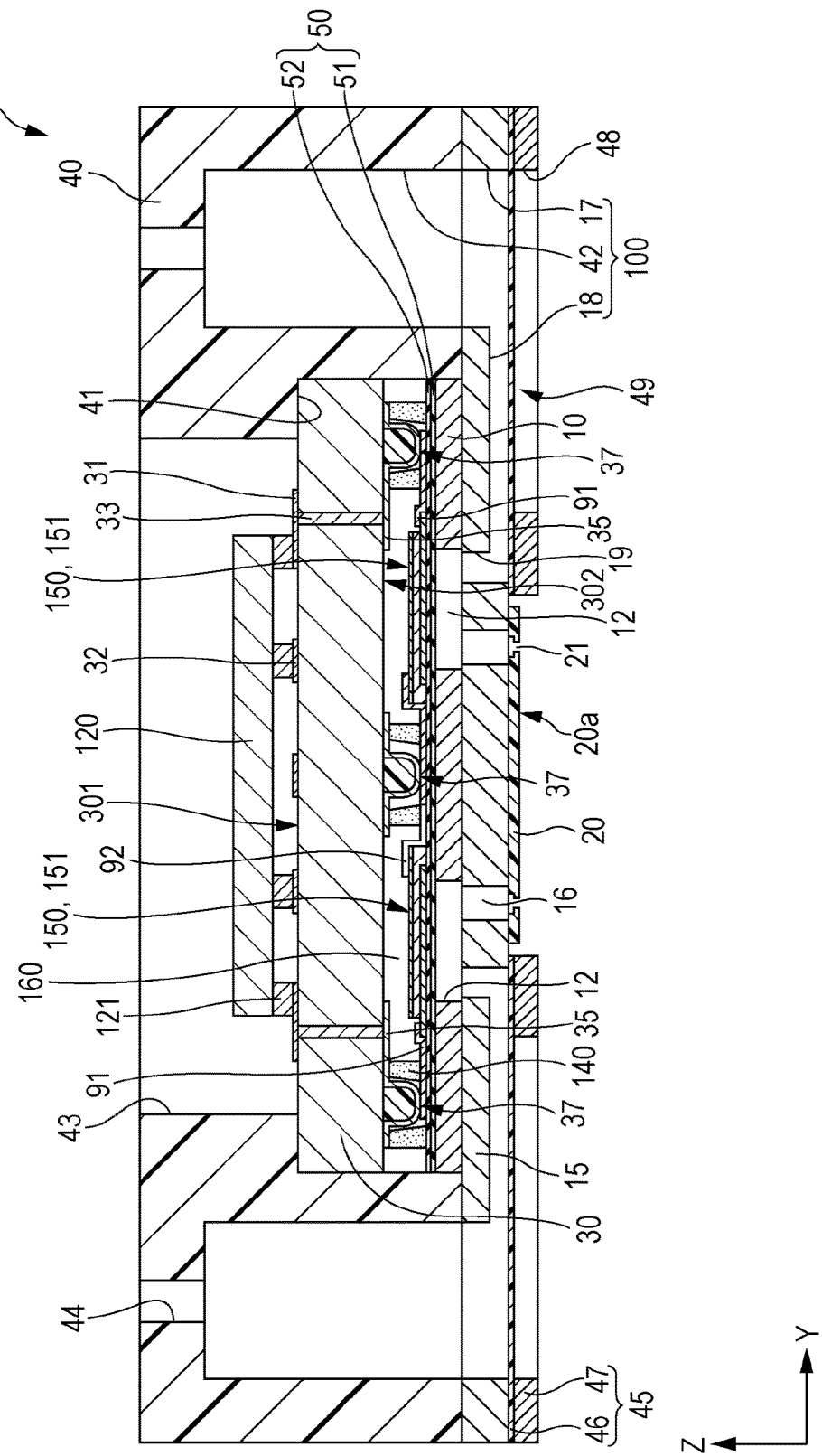
FIG. 3 is a sectional view taken along line III-III in FIG. 2.
Figure 4:
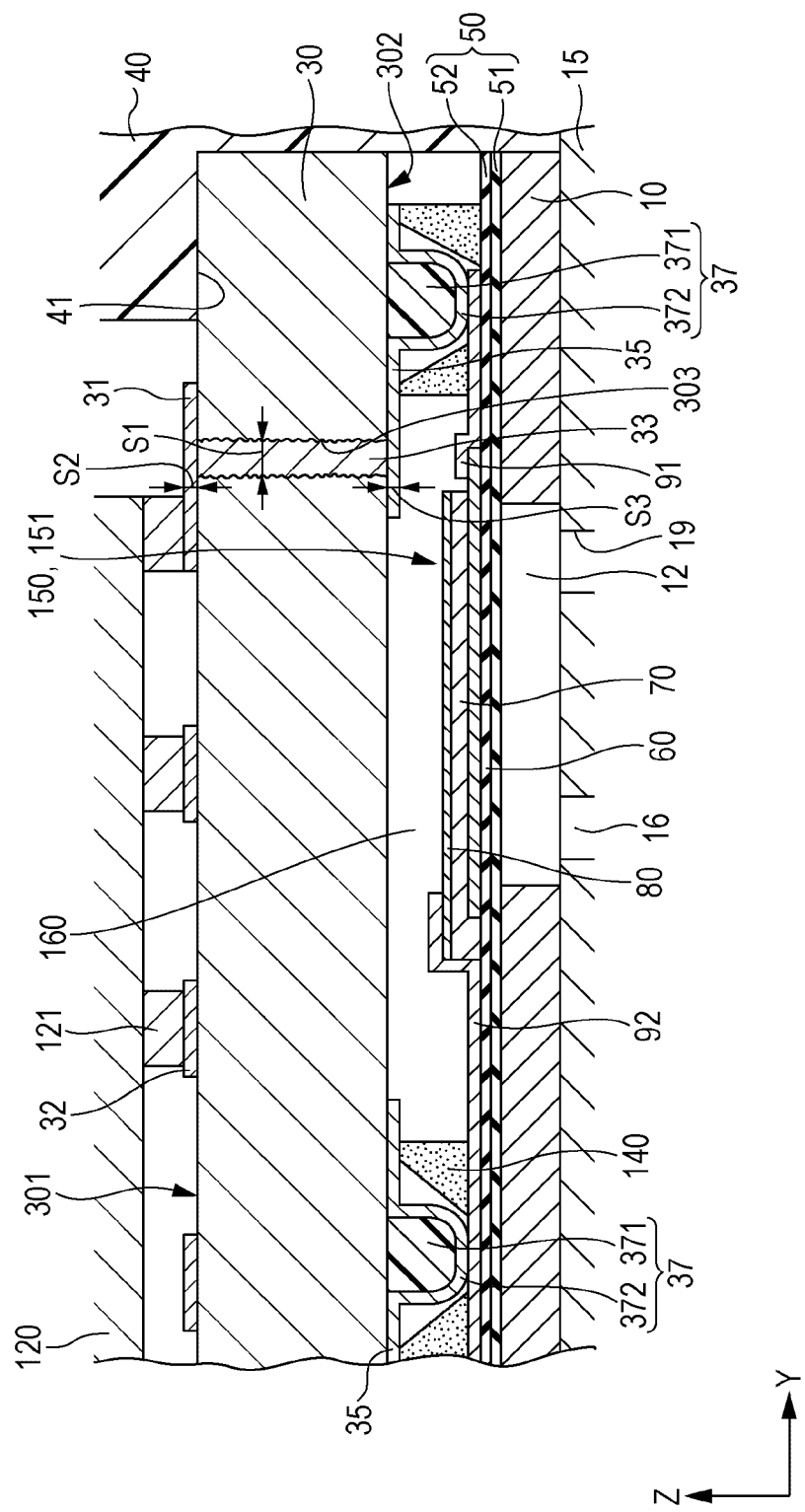
FIG. 4 is an enlarged sectional view illustrating a main portion of FIG. 3.
Figure 5:
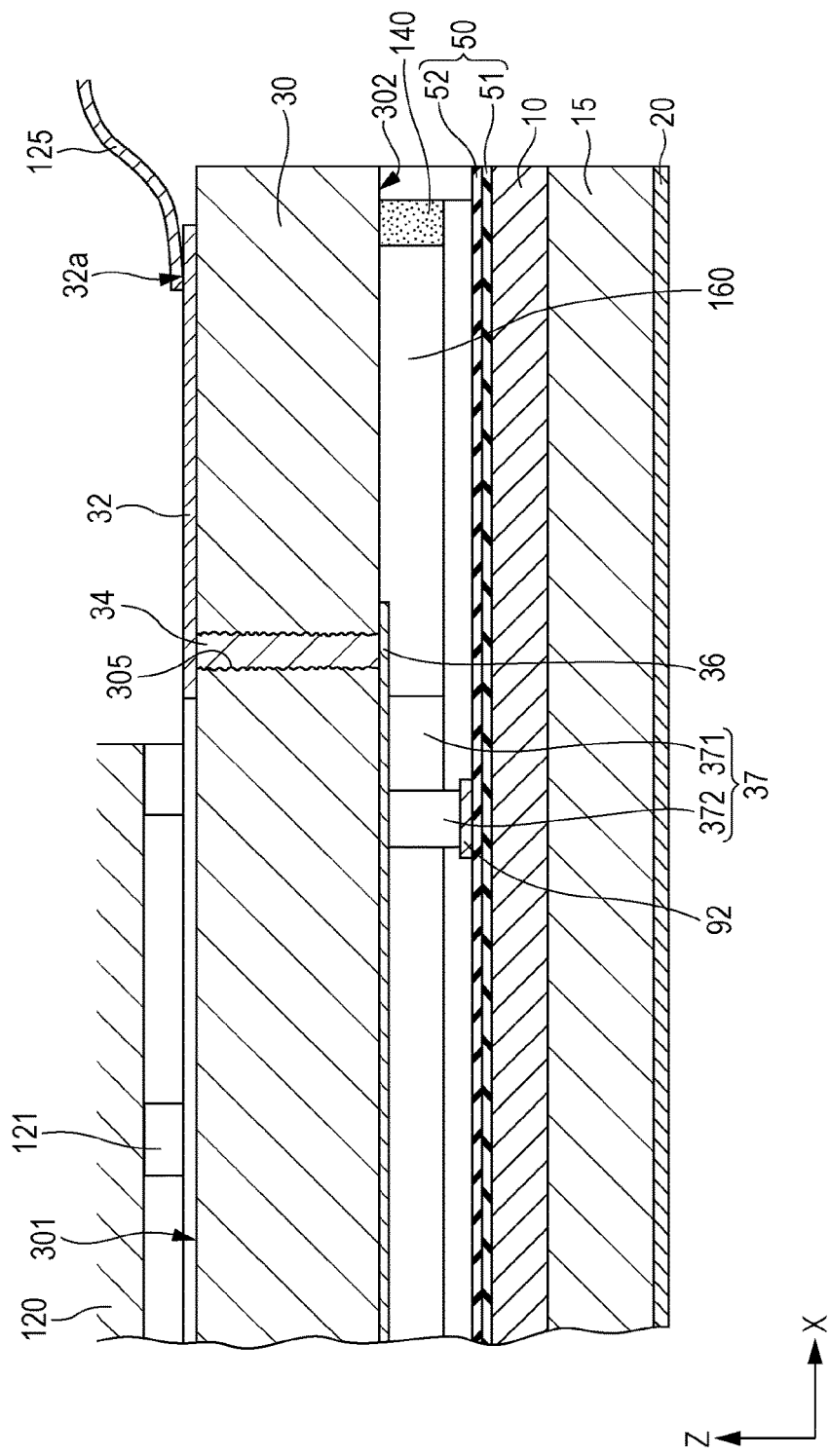
FIG. 5 is a sectional view taken along line V-V in FIG. 2.
Figure 6:
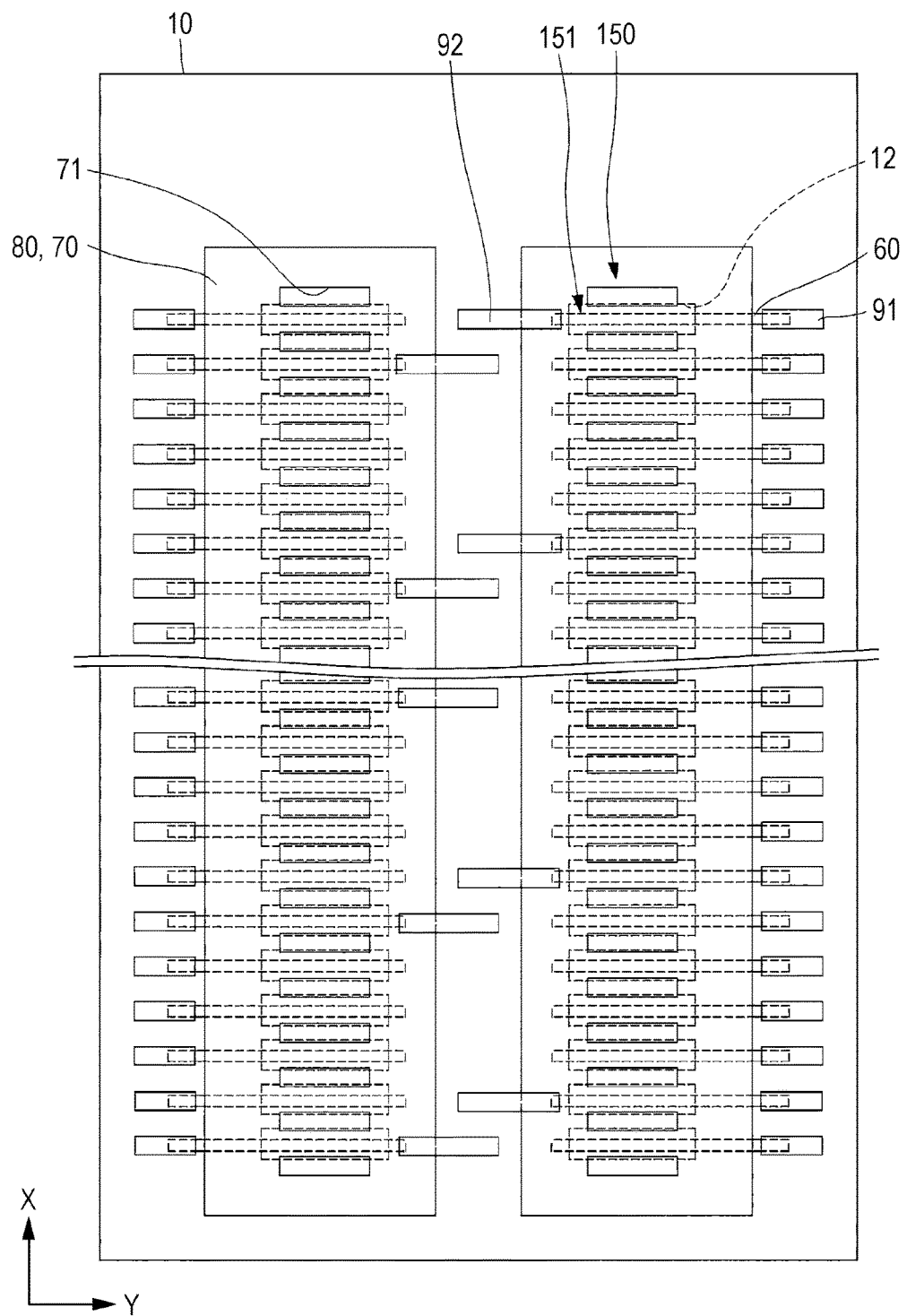
FIG. 6 is a plan view of a channel formation substrate.

FIG. 1 is an exploded perspective view of a recording head, FIG. 2 is a plan view (a plan view of a liquid ejecting surface 20a side) of the recording head, FIG. 3 is a sectional view taken along line III-III in FIG. 2, FIG. 4 is an enlarged sectional view illustrating a main portion of FIG. 3, FIG. 5 is a sectional view taken along line V-V in FIG. 2, and FIG. 6 is a plan view of a channel formation substrate.

A recording head 1 is provided with a plurality of members such a channel formation substrate 10, a communicating plate 15, a nozzle plate 20, a driving wiring substrate 30, and a compliance board 45. The driving wiring substrate 30 is an example of a wiring substrate according to the aspect of the invention.

The channel formation substrate 10 is a piezo element substrate on which a piezo element is provided. The channel formation substrate 10 can be formed of, for example, metal such as a stainless steel or Ni, a ceramic material such as $ZrO_2$ or $Al_2O_3$, a glass ceramic material, and an oxide such as MgO and $LaAlO_3$. In the embodiment, the channel formation substrate 10 is formed of a silicon single crystal substrate. By performing anisotropic etching to the channel formation substrate 10 from one surface side, a pressure chambers 12 which are partitioned off by a plurality of partition walls are arranged along a direction in which a plurality of nozzles 21 which discharge ink are arranged.

The direction in which the pressure chambers 12 are arranged is referred to as a juxtaposing direction of the pressure chambers 12, or a first direction X. In addition, on the channel formation substrate 10, a plurality of rows of the pressure chambers 12 are arranged in the first direction X, and two rows are provided in the embodiment. Hereinafter, a row direction in which a plurality of rows of the pressure chambers 12 are formed along the first direction X is referred to as a second direction Y. In addition, a direction intersecting with the first direction X and the second direction Y is referred to as a third direction Z in the embodiment. Coordinate axes shown in each of the drawings respectively represent the first direction X, the second direction Y, and the third direction Z, and the direction toward an arrow is referred to as a positive (+) direction, and an opposite direction is referred to as a negative (−) direction. Note that, the directions (X, Y, and Z) are set to be orthogonal to each other in the embodiment; however, components are not limited to be orthogonally disposed.

On the channel formation substrate 10, a supply path which is smaller than an opening area of the pressure chamber 12 and applies a channel resistance to ink flowing into the pressure chamber 12 may be provided at one end portion of the pressure chamber 12 in the second direction Y.

On one surface side of the channel formation substrate 10 (the side opposite to the driving wiring substrate 30 (−Z direction side)), the communicating plate 15 and the nozzle plate 20 are sequentially laminated mainly as illustrated in FIG. 3. That is, the communicating plate 15 is provided on the one surface of the channel formation substrate 10, and a nozzle plate 20 having nozzles 21 is provided on the surface side opposite to the side of the channel formation substrate 10 on which the communicating plate 15 is provided.

The communicating plate 15 is provided with a nozzle communicating path 16 through which the pressure chamber 12 and the nozzle 21 communicate with each other. The communicating plate 15 has a larger area than the channel formation substrate 10, and the nozzle plate 20 has a smaller area than the channel formation substrate 10. With such a communicating plate 15 being provided, the nozzle 21 of the nozzle plate 20 and the pressure chamber 12 can be separated from each other, and thus the ink in the pressure chamber 12 is less likely to be susceptible of thickening due to evaporation of water in the ink occurring in the vicinity of the nozzle 21. In addition, the nozzle plate 20 may only cover openings in the nozzle communicating path 16 through which the pressure chamber 12 and the nozzle 21 communicate with each other, and thus it is possible to relatively reduce the area of the nozzle plate 20, and thereby to realize the cost reduction. In addition, in the embodiment, a surface from which an ink droplet is discharged (the surface on the −Z side of the nozzle plate 20) is referred to as a liquid ejecting surface 20a.

In addition, the communicating plate 15 is provided with a first manifold portion 17 and a second manifold portion 18 which form a portion of a manifold 100.

The first manifold portion 17 is provided by passing through the communicating plate 15 in a thickness direction (a direction in which the communicating plate 15 and the channel formation substrate 10 are laminated). The second manifold portion 18 is provided by being opened to the nozzle plate 20 side of the communicating plate 15 without passing through the communicating plate 15 in the thickness direction.

In addition, on the communicating plate 15, a supply communicating path 19 which communicates with one end portion of the pressure chamber 12 in the second direction Y is independently provided for each pressure chamber 12. The second manifold portion 18 and the pressure chamber 12 communicate with each other through the supply communicating path 19.

Such a communicating plate 15 can be formed of metal such as a stainless steel or Ni, or ceramics such as zirconium. In addition, the communicating plate 15 is preferably formed of a material having the same linear expansion coefficient as that of the channel formation substrate 10. That is, in a case where a material having a different linear expansion coefficient different from that of the channel formation substrate 10 is used as the communicating plate 15, when heating and cooling the communicating plate 15, a warpage is likely to occur on the communicating plate 15 due to a difference of the linear expansion coefficient between the channel formation substrate 10 and the communicating plate 15. In the embodiment, it is possible to suppress the occurrence of warpage by being heated and cooled, cracks due to heat, or peeling by using a material which is the same as that of the channel formation substrate 10, that is, a silicon single crystal substrate, as the communicating plate 15.

The nozzle 21 which communicates with each of the pressure chambers 12 through the nozzle communicating path 16 is formed on the nozzle plate 20. Such nozzles 21 are arranged in the first direction X, and two rows of the rows of the nozzles 21, each of which is formed of the nozzles 21 arranged in the first direction X, are formed in the second direction Y.

As such a nozzle plate 20, it is possible to use, for example, metal such as a stainless steel (SUS), an organic material such as a polyimide resin, and a silicon single crystal substrate. In addition, when using the silicon single crystal substrate as the nozzle plate 20, the linear expansion coefficient between the nozzle plate 20 and the communicating plate 15 is the same, and thus it is possible to suppress the occurrence of the warpage by being heated and cooled, cracks due to heat, or peeling.

A vibrating plate 50 is formed on the surface side (the driving wiring substrate 30 side (+Z direction)) opposite to side of the channel formation substrate 10 on which the communicating plate 15 is provided. In the embodiment, as the vibrating plate 50, an elastic film 51 which is provided on the channel formation substrate 10 side and is formed of a silicon oxide, and an insulator film 52 which is provided on the elastic film 51, and is formed of a zirconium oxide. In addition, a liquid flow path such as the pressure chamber 12 is formed by performing the anisotropic etching on the channel formation substrate 10 from one surface side (the surface side to which the communicating plate 15 is bonded), and the other surface of the liquid flow path such as the pressure chamber 12 is partitioned by the elastic film 51. Needless to say, the vibrating plate 50 is not particularly limited to this configuration, for example, the vibrating plate 50 may be formed by providing any one of the elastic film 51 and the insulator film 52, or may be provided with other films.

A piezoelectric actuator 150 which is a piezo element for causing the pressure change of ink in the pressure chamber 12 of the embodiment is provided on the vibrating plate 50 of the channel formation substrate 10. As described above, on the channel formation substrate 10, the plurality of the pressure chambers 12 are arranged along the first direction X, and the two rows of the pressure chambers 12 are arranged along the second direction Y. In the piezoelectric actuator 150, the active portions 151 which are substantial active portions are arranged in the first direction X and form a row, and two rows of the active portion 151 of the piezoelectric actuator row 150 are arranged in the second direction Y.

The piezoelectric actuator 150 includes a first electrode 60, a piezoelectric layer 70, and a second electrode 80 which are sequentially laminated from the vibrating plate 50 side. The first electrodes 60 which form the piezoelectric actuator 150 are cut and divided for each pressure chamber 12 so as to form an individual electrode for each active portion 151 which is a substantial active portion of the piezoelectric actuator 150. A material of such a first electrode 60 is not limited as long as it is a metallic material, and for example, platinum (Pt) and iridium (Ir) are preferably used.

The piezoelectric layer 70 is continuously provided in the first direction X such that the second direction Y becomes a predetermined width. An end portion of the piezoelectric layer 70 on one end portion side (the side opposite to the manifold 100) of the pressure chamber 12 in the second direction Y is positioned on the outside from the end portion of the first electrode 60. That is, the end portion of the first electrode 60 is covered with the piezoelectric layer 70. In addition, an end portion of the piezoelectric layer 70 on the other end side of the pressure chamber 12 in the second direction Y which is the manifold 100 side is positioned on the inner side (the pressure chamber 12 side) from the end portion of the first electrode 60, and the end portion of the first electrode 60 on the manifold 100 side is not covered with the piezoelectric layer 70.

The piezoelectric layer 70 is formed of a piezoelectric material such as an oxide having a polarization structure which is formed on the first electrode 60, and can be formed of, for example, a perovskite type oxide expressed by a general formula of $ABO_3$. As the perovskite type oxide used for the piezoelectric layer 70, for example, a lead based piezoelectric material including lead or a non-lead based piezoelectric material which does not include the lead can be used.

As illustrated in FIG. 6, the piezoelectric layer 70 is provided with a recessed portion 71 corresponding to each partition wall between the pressure chambers 12. In this way, when the piezoelectric layer 70 is provided with the recessed portion 71, the piezoelectric actuator 150 can be favorably displaced.

The second electrode 80 is provided on the surface opposite to the surface of the piezoelectric layer 70 on which the first electrode 60 is provided, and forms a common electrode which is common to a plurality of the active portions 151. The second electrode 80 is provided on the inside of the recessed portion 71 of the piezoelectric layer 70; however, the position of the second electrode 80 is not particularly limited, and thus it may be not the inside of the recessed portion 71.

The piezoelectric actuator 150 which is formed of the first electrode 60, the piezoelectric layer 70, and the second electrode 80 is displaced by applying a voltage between the first electrode 60 and the second electrode 80. That is, when the voltage is applied between both electrodes, piezoelectric strain occurs in the piezoelectric layer 70 which is pinched between the first electrode 60 and the second electrode 80. In addition, at the time of applying the voltage to both electrodes, a portion of the piezoelectric layer 70 in which the piezoelectric strain occurs is referred to as an active portion 151.

As described above, in the piezoelectric actuator 150, the first electrode 60 is independently provided for each of the plurality of the active portions 151 so as to be an individual electrode, and the second electrode 80 is continuously provided throughout the plurality of the active portions 151 so as to be a common electrode. Needless to say, without being limited to such a configuration, for example, the first electrode 60 may be continuously provided throughout the plurality of the active portions 151 so as to be a common electrode, and the second electrode may be independently provided for each of the plurality of the active portions 151 so as to be an individual electrode. In addition, for the vibrating plate 50, only the first electrode 60 may serve as a vibrating plate without providing the elastic film 51 and the insulator film 52. In addition, the piezoelectric actuator 150 may substantially serve as vibrating plate. In the embodiment, the active portions 151 of the piezoelectric actuator 150 are arranged in the first direction X corresponding to the pressure chambers 12, and two rows of the rows of the active portions 151 which are arranged in the first direction X are provided in the second direction Y.

An individual lead electrode 91 which is a lead-out wiring is drawn out from the first electrode 60 of the piezoelectric actuator 150. The individual lead electrode 91 is drawn from each row of the active portions 151 to the outside of the row in the second direction Y.

A common lead electrode 92 which is the lead-out wiring is drawn out from the second electrode 80 of the piezoelectric actuator 150. In the embodiment, the common lead electrode 92 is electrically connected to the second electrode 80 in each of the two rows of the piezoelectric actuators 150. In addition, one common lead electrode 92 is provided with respect to the plurality of active portions 151.

A driving wiring substrate 30 is bonded onto the surface of the channel formation substrate 10 on the piezoelectric actuator 150 side. The driving wiring substrate 30 has substantially the same size as that of the channel formation substrate 10.

The driving wiring substrate 30 is formed of the same material as that of the channel formation substrate 10, and in the embodiment, the driving wiring substrate 30 is formed of a silicon single crystal substrate. The surface (+Z) on the side opposite to the channel formation substrate 10 of the driving wiring substrate 30 is referred to as a first main surface 301, and the surface (−Z) on the channel formation substrate 10 side is referred to as a second main surface 302. In addition, a driving circuit 120 such as a driving IC (also referred to as a driver IC) which is a driving element for outputting a signal for driving the piezoelectric actuator 150 is mounted on the first main surface 301 of the driving wiring substrate 30.

Such a driving wiring substrate 30 is provided such that the first direction X, in which the active portions 151 of each row of the piezoelectric actuator 150 are arranged, is elongated. That is, the driving wiring substrate 30 is disposed such that the first direction X is a longitudinal direction and the second direction Y is a transvers direction.

In addition, a first individual wiring 31 and a supply wiring 32 are provided on the first main surface 301 of driving wiring substrate 30. The first individual wiring 31 and the supply wiring 32 are examples of the surface wiring of the aspect of the invention.

The plurality of first individual wirings 31 are arranged in the first direction X at both end portions in the second direction Y. Further, the first individual wiring 31 is extended along the second direction Y, one end portion thereof is electrically connected to each terminal 121 of the driving circuit 120, and the other end portion is electrically connected to a first through wiring 33 which passes through the driving wiring substrate 30 in the third direction Z which is a thickness direction.

The first through wiring 33 is provided inside a first through hole 303 provided by passing through the driving wiring substrate 30 in the third direction Z which is the thickness direction, and is a wiring for relaying between the first main surface 301 and the second main surface 302. The first through hole 303 in which the first through wiring 33 is provided will be described in detail below, and the driving wiring substrate 30 can be formed through laser processing, inductively coupled plasma (ICP) processing, and etching processing. Such a first through hole 303 is filled with the first through wiring 33. Note that, the first through wiring 33 is formed of metal such as copper (Cu), and can be formed through electrolytic plating, electroless plating, and the like.

The first through wiring 33 is electrically connected to a second individual wiring 35 on the second main surface 302. The second individual wiring 35 is electrically connected to an individual lead electrode 91 connected to the first electrode 60 which is an individual lead electrode independent from each of the active portions 151 of the piezoelectric actuator 150. That is, the first individual wiring 31, the first through wiring 33, and the second individual wiring 35 are provided in the same number as that of the first electrode 60 of the piezoelectric actuator 150. Note that, the first individual wiring 31 and the second individual wiring 35 can be formed by using a sputtering method, for example.

The supply wiring 32 is a wiring for supplying a power source of the driving circuit 120, a ground (GND), a diving signal (COM), a control signal of the driving circuit 120, and a bias voltage (vbs) applied to the second electrode 80 which is a common electrode of a piezoelectric actuator 150, from an external wiring 125. A plurality of the supply wirings 32 are provided for each use described above.

In addition, the supply wiring 32 is extended to the vicinity of one end portion (+X side) of the driving wiring substrate 30 in the first direction X, and the external wiring 125 such as FPC is electrically connected to the extended end portion. That is, one end portion of the supply wiring 32 corresponds to an electrode pad 32a which is connected to the external wiring 125. Note that, although not particularly illustrated, the external wiring 125 is connected to a control element such as a control circuit, and as described above, supplies a power source, a ground (GND), a driving signal (COM), a control signal of the driving circuit 120, and a bias voltage (vbs) applied to the second electrode 80 which is a common electrode of a piezoelectric actuator 150 to the supply wiring 32 from the control element. Incidentally, in the embodiment, the supply wiring 32 which supplies the bias voltage to the second electrode 80 of the piezoelectric actuator 150 is electrically connected to the second electrode 80 which is a common electrode of the piezoelectric actuator 150 without being connected to the driving circuit 120. In addition, although not particularly illustrated, other supply wirings 32 are electrically connected to the driving circuit 120, and a power source for a high voltage circuit and a low voltage circuit of the driving circuit 120, a ground (GND), a driving signal (COM), and a control signal of the driving circuit 120 to the driving circuit 120 from the external wiring 125.

As illustrated in FIG. 5, the supply wiring 32 for supplying the bias voltage is electrically connected to a second through wiring 34 which is provided on the driving wiring substrate 30.

The second through wiring 34 is formed inside a second through hole 305 which is formed by passing through the third direction Z. Further, the end surface on the first main surface 301 side of the second through wiring 34 is covered with the supply wiring 32 such that both are electrically connected to each other. Note that, similar to the above-described first through wiring 33, the second through wiring 34 can form metal such as copper (Cu) by electroplating, electroless plating or the like.

In this way, the driving circuit 120 is mounted on the first individual wiring 31 and the supply wiring 32 which are provided on the first main surface 301 of the driving wiring substrate 30. That is, the terminal 121 of the driving circuit 120 is electrically connected to the first individual wiring 31 and the supply wiring 32.

The second individual wiring 35 which is electrically connected to the first through wiring 33, and a connection wiring 36 which is connected to the second through wiring 34 are provided on the second main surface 302 of driving wiring substrate 30. The second individual wiring 35 and the connection wiring 36 are electrically connected to the individual lead electrode 91 and a common lead electrode 92 by a bump electrode 37, respectively.

The bump electrode 37 includes, for example, a core portion 371 which is formed of a resin material having elastic properties and a bump wiring 372 which covers at least a portion of the surface of the core portion 371.

The core portion 371 is formed of a photosensitive insulating resin or a thermosetting insulating resin such as a polyimide resin, an acrylic resin, a phenol resin, a silicone resin, a silicone-modified polyimide resin, and an epoxy resin.

In addition, the core portion 371 is formed into a substantially semispherical shape before the driving wiring substrate 30 and the channel formation substrate 10 are connected to each other. Here, the semispherical shape means a columnar shape of which an inner surface (a bottom surface) coming in contact with the driving wiring substrate 30 is a flat surface and an outer surface side which is a non-contact surface is a curved surface. Specifically, the substantially semispherical shape includes a case where a cross-section is formed into a substantially semicircle shape, a substantially semielliptical shape, or a substantially trapezoid shape.

In addition, when the core portion 371 is compressed such that the driving wiring substrate 30 and the channel formation substrate 10 are relatively close to be each other, a distal end shape thereof is elastically deformed as the surface shape of the individual lead electrode 91 and the common lead electrode 92. With this, even though the warpage and undulation occur on the driving wiring substrate 30 or the channel formation substrate 10, the core portion 371 is deformed in accordance with the warpage and undulation, and the bump electrode 37, and the individual lead electrode 91 and the common lead electrode 92 can be surely connected to each other.

The core portion 371 is continuously disposed in a linear manner in the first direction X. In addition, a plurality of the core portions 371 are arranged in the second direction Y. In the embodiment, there are provided three core portions 371 in total such that each of two core portions 371 is provided on the outside of each of two rows of the active portions 151 of the piezoelectric actuator 150, and one core portion 371 is provided between two rows of the active portions 151 of the piezoelectric actuator 150 in the second direction Y. Further, each of the core portions 371 which are provided on the outside of the two active portions 151 of the piezoelectric actuator 150 forms the bump electrode 37 for connecting the second individual wiring 35 to the individual lead electrode 91. In addition, the core portion 371 provided between the two rows of the active portions 151 of the piezoelectric actuator 150 forms the bump electrode 37 for connecting the connection wiring 36 and the common lead electrode 92 of the two rows of the piezoelectric actuator 150. Such a core portion 371 can be formed by using photolithography technique and etching technique.

The bump wiring 372 covers at least a portion of the surface of the core portion 371. The bump wiring 372 is formed of metal, for example, Au, TiW, Cu, Cr (chrome), Ni, Ti, W, NiV, Al, Pd (palladium), and a lead-free solder, or an array, and these may be a single layer or a multiple layer. In addition, the bump wiring 372 is deformed as the surface shape of the first individual wiring 31 and the supply wiring 32 due to the elastically deformed core portion 371, and is electrically bonded to each of the individual lead electrode 91 and the common lead electrode 92. In the embodiment, an adhesive layer 140 is provided between the driving wiring substrate 30 and the channel formation substrate 10, and the driving wiring substrate 30 and the channel formation substrate 10 are bonded to each other by the adhesive layer 140 so as to maintain the state in which the bump electrode 37, and the individual lead electrode 91 and the common lead electrode 92 are connected to each other.

In the embodiment, the bump wiring 372 for connecting the second individual wiring 35 to the individual lead electrode 91 is formed by extending the second individual wiring 35 to the top of the core portion 371. That is, the plurality of second individual wirings 35 are extended to the top of the core portion 371 so as to form a plurality of the bump wirings 372. The bump wiring 372 for connecting the connection wiring 36 to the common lead electrode 92 forms by extending the connection wiring 36 to the top of the core portion 371. In the embodiment, the plurality of the connection wirings 36 are provided so as to face the plurality of common lead electrodes 92. The connection wirings 36 form a plurality of bump wirings 372 which are extended to the top of the core portion 371. The connection wirings 36 are arranged apart from each other on the core portion 371, but are electrically connected to each other on the second main surface 302 and thus are connected to one of the supply wirings 32 via the second through wiring 34. Note that, a configuration such that the second individual wiring 35, the connection wiring 36, and each of the bump wirings 372 are set as individual wire, and a portion thereof is stacked on each other so as to be electrically connected to each other may be also employed.

The electrical connection between the second individual wiring 35 and the connection wiring 36, and the electrical connection between and the individual lead electrode 91 and the common lead electrode 92 are not limited to the above-described bump electrode 37, for example, a metal bump may be used as well. Further, the connection between second individual wiring 35 and the connection wiring 36, and the connection between the individual lead electrode 91 and the common lead electrode 92 may be performed by welding such as solder connection or crimping with an anisotropic conductive adhesive (ACP, ACF) and a nonconductive adhesive (NCP, NCF) interposed therebetween. Further, similarly, the above-described terminal 121 of the driving circuit 120, and the first individual wiring 31 and the supply wiring 32 also may be connected to each other by using a bump electrode or a metal bump. In addition, the connection between the terminal 121 of the driving circuit 120, and the first individual wiring 31 and the supply wiring 32 may be performed by welding such as solder connection or crimping with an anisotropic conductive adhesive (ACP, ACF) and a nonconductive adhesive (NCP, NCF) interposed therebetween.

In this way, when the second individual wiring 35 is connected to the individual lead electrode 91, the terminal 121 of the driving circuit 120 is electrically connected to the first electrode 60 of the active portion 151 via the first individual wiring 31, the first through wiring 33, the second individual wiring 35, and the individual lead electrode 91 such that the driving signal is supplied to each of the active portions 151 from the driving circuit 120. In addition, when the connection wiring 36 is connected to the common lead electrode 92, the bias voltage is supplied to the second electrode 80 of the piezoelectric actuator 150 from the external wiring 125.

In this way, when the channel formation substrate 10 and the driving wiring substrate 30 are bonded to each other via the adhesive layer 140, a holding portion 160 which is a space in which the piezoelectric actuator 150 is disposed is formed between the channel formation substrate 10 and the driving wiring substrate 30.

As described above, in the recording head 1 according to the embodiment, the piezoelectric actuator 150 is accommodated in the holding portion 160, and the driving circuit 120 is provided on the first main surface 301 side of the driving wiring substrate 30. The driving circuit 120 is disposed on the side opposite to the piezoelectric actuator 150 (a so-called face down disposition). In addition, the piezoelectric actuator 150 and the driving circuit 120 are electrically connected to each other by the first through wiring 33 and the second through wiring 34 which pass through the driving wiring substrate 30 and extend in the third direction Z. For this reason, it is possible to realize the miniaturization of the recording head 1 by preventing the driving wiring substrate 30 and the channel formation substrate 10 from being large in order to draw a wiring for connecting the driving circuit 120 which is mounted on the first main surface 301 of the driving wiring substrate 30 to the piezoelectric actuator 150 which is disposed on the second main surface 302 side of the driving wiring substrate 30.

As illustrate in FIG. 1 to FIG. 3, a case member 40 which forms the manifold 100 communicating with the plurality of pressure chambers 12 is fixed to a bonding body formed of the channel formation substrate 10, the driving wiring substrate 30, the communicating plate 15, and the nozzle plate 20. The case member 40 is formed into the substantially the same shape as that of the communicating plate 15, and is bonded to the driving wiring substrate 30 and the aforementioned communicating plate 15. Specifically, the case member 40 includes a recessed portion 41 having a depth for accommodating the channel formation substrate 10 and the driving wiring substrate 30 on the driving wiring substrate 30 side. The recessed portion 41 includes an opening area larger than the surface which is bonded to the channel formation substrate 10 of the driving wiring substrate 30. In addition, in a state where the channel formation substrate 10 and the like are accommodated in the recessed portion 41, the opening surface of the recessed portion 41 on the nozzle plate 20 side is sealed by the communicating plate 15. In addition, the case member 40 is provided with a third manifold portion 42 having a recessed shape on both sides of the recessed portion 41 in the second direction Y. The third manifold portion 42, the first manifold portion 17 provided on the communicating plate 15, and the second manifold portion 18 constitute the manifold 100 of the embodiment.

As a material of the case member 40, for example, a resin or metal can be used. In addition, when a resin material is molded as the case member 40, it can be mass-produced at low cost.

The compliance board 45 is provided on the surface of the communicating plate 15 on the nozzle plate 20 side. The compliance board 45 seals the openings of the first manifold portion 17 and the second manifold portion 18 on the nozzle plate 20 side. Such a compliance board 45 is provided with a sealing film 46 and a fixing substrate 47 in the embodiment. The sealing film 46 is formed of a thin film having flexibility (for example, a thin film having a thickness of 20 μm or less, which is formed of polyphenylene sulfide (PPS), the stainless steel (SUS), or the like), and the fixing substrate 47 is formed of a hard material formed of metal such as the stainless steel (SUS). The area of the fixing substrate 47 which faces the manifold 100 becomes an opening portion 48 which is completely removed in the thickness direction, and thus one surface of the manifold 100 becomes a compliance portion 49 which is a flexible portion sealed by only the sealing film 46 having flexibility.

The case member 40 is provided with an induction path 44 which communicates with the manifold 100 so as to supply ink to each of the manifolds 100. In addition, the case member 40 is provided with a connection port 43 to which the driving wiring substrate 30 is exposed and into which an external wiring is inserted, and the external wiring inserted into the connection port 43 is connected to the supply wiring 32 of the driving wiring substrate 30.

In the recording head 1 having such a configuration, at the time of ejecting the ink, the inside of channel from the manifold 100 to the nozzle 21 is filled with the ink from a liquid storage portion for storing ink via an induction path 44. Thereafter, in response to a signal from the driving circuit 120, the voltage is applied to each of piezoelectric actuator 150 corresponding to the pressure chamber 12, and thus the piezoelectric actuator 150 and the vibrating plate 50 are deformed to be bent. With this, the pressure in the pressure chamber 12 is increased and an ink droplet is ejected from a predetermined nozzle 21.

The driving wiring substrate 30 which is an example of the wiring substrate will be described in detail with reference to FIG. 4 and FIG. 5. As described above, the driving wiring substrate 30 is provided with the first individual wiring 31 and the supply wiring 32 which are provided on the first main surface 301, and the second individual wiring 35 and the connection wiring 36 which are provided on the second main surface 302 as the surface wiring, the first through hole 303 and the second through hole 305 as the through hole which passes through the driving wiring substrate 30, and the first through wiring 33 and the second through wiring 34 as the through wiring formed in the through hole.

The first through hole 303 is a through hole which passes through the driving wiring substrate 30 in the thickness direction (the third direction Z), and the inner surface becomes a rough surface. The rough surface means a surface entirely having minute unevenness to the extent that serves as an anchor surface for improving adhesion with respect to the first through wiring 33. At least, the inner surface of the first through hole 303 is roughened more than the surface such as the first main surface 301 which is subjected to a polishing treatment. The degree of the inner surface of the first through hole 303, that is, the average surface roughness Ra is in a range of 0.1 μm to 5 μm, and is preferably in a range of 0.1 μm to 3 μm. If the degree of the roughness is within the above-described range, it is possible to obtain a preferable anchoring effect. Note that, the average surface roughness Ra can be measured by using a confocal optical microscope based on JIS B 0601: 2001.

The first through wiring 33 is filled with the first through hole 303. For this reason, the adhesion of the first through wiring 33 with respect to the inner surface of the first through hole 303 is improved by the anchoring effect due to the minute unevenness provided in the inner surface of the first through hole 303.

The adhesion of the inner surface of the first through hole 303 and the first through wiring 33 is improved, and thus it is possible to prevent the first through wiring 33 from being deviated from the first through hole 303. Accordingly, there is a difference of the linear expansion coefficient between the driving wiring substrate 30, on which the first through hole 303 is formed, and the first through wiring 33, and thus even though temperature change occurs, it is possible to prevent the first through wiring 33 from being deviated from the first through hole 303.

The first through wiring 33 is connected to the first individual wiring 31 so as to cover the end surface of the first main surface 301 side of the driving wiring substrate 30, and is connected to the second individual wiring 35 so as to cover the end surface of the second main surface 302 side of the driving wiring substrate 30. Since it is possible to prevent the first through wiring 33 from being deviated, the first through wiring 33 protrudes from the first through hole 303 and thus it is possible to prevent the first individual wiring 31 and the second individual wiring 35 from being disconnected.

In this way, the first through wiring 33, and the first individual wiring 31 and the second individual wiring 35 are less likely to be disconnected, and thus the reliability of the driving wiring substrate 30 according to the embodiment is improved. The same is true for the second through wiring 34 which is provided in the second through hole 305. That is, the second through wiring 34, and the supply wiring 32 and the connection wiring 36 are less likely to be disconnected, and thus the reliability is improved.

In addition, a cross-sectional area of the first through wiring 33 is set to as S1. The cross-sectional area of the first through wiring 33 means an area of the cross section orthogonal to the penetrating direction. There is no particular limitation as to which position in the thickness direction (the third direction Z) of the driving wiring substrate 30 is defined as a cross section. The smallest cross-sectional area among the cross-sectional areas at arbitrary positions may be used, or the average of the cross-sectional areas at a plurality of locations may be used.

A cross-sectional area of the first individual wiring 31 connected to the first through wiring 33 is set as S2, and a cross-sectional area of the second individual wiring 35 is set as S3. The cross-sectional areas of the first individual wiring 31 and the second individual wiring 35 (surface wiring) are areas of the cross section parallel to the direction through which the first through wiring 33 passes. In addition, the cross-sectional area is an area of the cross section orthogonal to the direction in which a current flows. In the embodiment, the first individual wiring 31 extended along the second direction Y, and thus is the cross-sectional area when a plan (XZ plan) orthogonal to the second direction Y is set as a cross section. The same is true for the second individual wiring 35. There is no limitation as to which position of the first individual wiring 31 and the second individual wiring 35 is defined as a cross section. The smallest cross-sectional area among the cross-sectional areas at arbitrary positions may be used, or the average of the cross-sectional areas at a plurality of locations may be used.

The above-described cross-sectional area S1 of the first through wiring 33 is equal to or larger than the cross-sectional area S2 of the first individual wiring 31. Further, the cross-sectional area S1 of the first through wiring 33 is equal to or larger than the cross-sectional area S3 of the second individual wiring 35. The length of the third direction Z of the first through wiring 33 is equal to or shorter than the length of the first individual wiring 31 and the second individual wiring 35 (the length drawn on XY plane). Accordingly, the electric resistance of the first through wiring 33 is equal to or smaller than the electric resistance of the first individual wiring 31 and the second individual wiring 35.

Note that, the length and the cross-sectional area are not limited to the above description as long as the length and the cross-sectional area are sufficient such that the electric resistance of the first through wiring 33 is equal to or smaller than the electric resistance of the first individual wiring 31 and the second individual wiring 35. Further, the materials of the first individual wiring 31 and the second individual wiring 35 are not necessarily the same as each other, and may be different from each other. In a case where the materials forming the first individual wiring and the second individual wiring are different from each other, the first through wiring 33, the first individual wiring 31, and the second individual wiring 35 are formed such that the electric resistance obtained from the electric resistivity, the length, and the cross-sectional area of the material of the first through wiring 33 becomes equal to or smaller than the electric resistance obtained from the electric resistivity, the length, and the cross-sectional area of the material of the first individual wiring 31 and the second individual wiring 35.

As such, the electric resistance of the first through wiring 33 is equal to or smaller than the electric resistance of the first individual wiring 31 and the second individual wiring 35 of the surface wiring, and thus the driving wiring substrate 30 according to the embodiment can prevent loss resistance in the first through wiring 33. The same is true for the second through wiring 34 which is provided in the second through hole 305. That is, the electric resistance of the second through wiring 34 is equal to or smaller than the electric resistance of the supply wiring 32 and the connection wiring 36, and thus it is possible to prevent loss resistance in the second through wiring 34.

In the recording head 1 which is provided with the above-described driving wiring substrate 30, the first through wiring 33 and the second through wiring 34 are prevented from being deviated in the driving wiring substrate 30, and the first individual wiring 31, the second individual wiring 35, the supply wiring 32, and the connection wiring 36 which are the surface wirings can be prevented from being disconnected. Accordingly, according to the invention, there is provided the recording head 1 having improved reliability.

Further, in the recording head 1, the loss resistance is prevented in the first through wiring 33 and the second through wiring 34 on the driving wiring substrate 30. With this, the recording head 1 can reliably transfer a driving signal to the piezo element 300, and thus it is possible to improve reliability of ink ejection by the piezo element 300.

Figure 7:
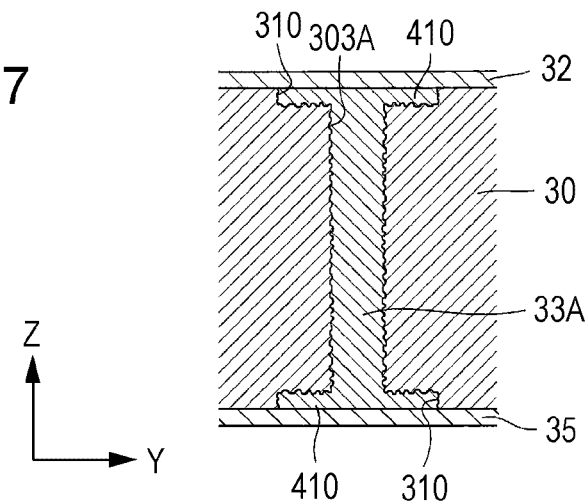
FIG. 7 is a sectional view illustrating a main portion of a driving wiring substrate illustrating a first through wiring according to Modification Example.
Figure 8:
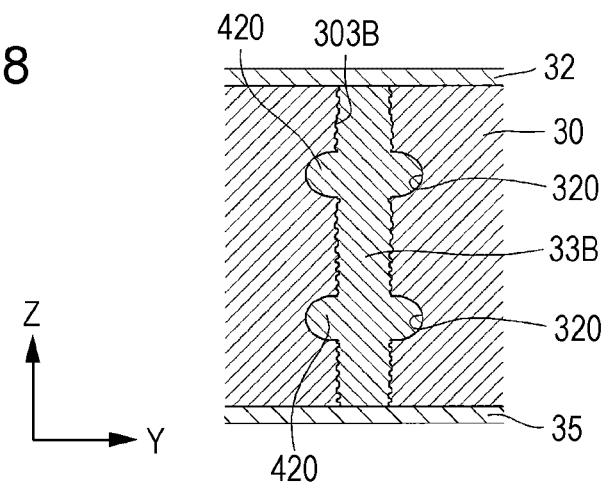
FIG. 8 is a sectional view illustrating a main portion of a driving wiring substrate illustrating a first through wiring according to Modification Example.
Figure 9:
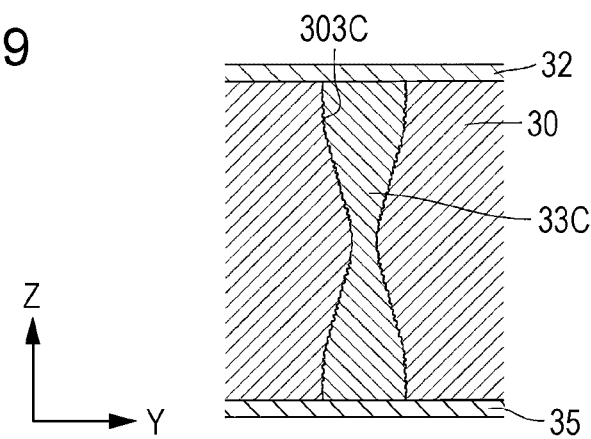
FIG. 9 is a sectional view illustrating a main portion of a driving wiring substrate illustrating a first through wiring according to Modification Example.

On the driving wiring substrate 30 described above, the first through wiring 33 and the second through wiring 34 are formed into almost a linear shape; however, the shape is not limited thereto. As long as the inner surface is a rough surface, it may be a through wiring in an arbitrary shape. The first through wiring 33 according to Modification Examples will be described with reference to FIG. 7 to FIG. 9. FIG. 7 to FIG. 9 are sectional views illustrating a main portion of the driving wiring substrate illustrating a first through wiring according to Modification Examples. Note that, the same reference numerals are given to the same components as those in the above-described embodiment, and repeated description will be omitted. Further, although this is Modification Example for the first through wiring 33, it can also be applied to the second through wiring 34.

As illustrated in FIG. 7, a first through hole 303A includes both surfaces of the driving wiring substrate 30, that is, an enlarged diameter portion 310 in which each opening of the first main surface 301 and the second main surface 302 is enlarged. In addition, the inner surface of the enlarged diameter portion 310 is also a rough surface similar to the case of the first through hole 303A. Such an enlarged diameter portion 310 is not necessary to be provided in both of the first main surface 301 and the second main surface 302, but may be provided at least one side surface thereof.

The first through wiring 33A is not only provided in the first through hole 303A formed into an almost linear shape, but also provided in the enlarged diameter portion 310. Among the first through wirings 33A, a portion which is provided in the enlarged diameter portion 310 and has enlarged width is referred to as an enlarged width portion 410.

When the first through wiring 33A is deformed to shrink in the third direction Z, the enlarged width portion 410 in the enlarged diameter portion 310 regulates the deformation. That is, the enlarged width portion 410 have a function of preventing the first through wiring 33A from being deviated with respect to the first through hole 303A. Since it is possible to prevent such a first through wiring 33A from being deformed, it is possible to further prevent the first through wiring 33A from being deviated with respect to the first through hole 303A.

As illustrated in FIG. 8, the first through hole 303B includes the enlarged diameter portion 320 which is enlarged in an intermediate part. Two enlarged diameter portions 320 are provided in the example in the drawings; however, there is no limit to the number. Further, the inner surface of the enlarged diameter portion 320 is not particularly provided with the rough surface; however, the rough surface which is the same as that of the first through hole 303 may be provided.

The first through wiring 33B is provided not only in the first through hole 303B, but also provided in the enlarged diameter portion 320. Among the first through wirings 33B, a portion which is provided in the enlarged diameter portion 320 and has enlarged width is referred to as an enlarged width portion 420.

When the first through wiring 33B is deformed to shrink or extend in the third direction Z, the enlarged width portion 420 in the enlarged diameter portion 320 regulates the deformation. That is, the enlarged width portion 420 have a function of preventing the first through wiring 33B from being deviated with respect to the first through hole 303B. Since it is possible to prevent such a first through wiring 33B from being deformed, it is possible to further prevent the first through wiring 33B from being deviated with respect to the first through hole 303B.

As illustrated in FIG. 9, the first through hole 303C is formed such that an aperture on the opening side is narrower than an aperture of the intermediate part. That is, the first through hole 303C is formed in a shape in which the opening is the widest and is narrowed at the center. The inner surface of such a first through hole 303C is provided with a rough surface which is the same as that of the first through hole 303. In addition, the first through wiring 33C is provided in the first through hole 303C.

When the first through wiring 33C is deformed to shrink or extend in the third direction Z, a narrow part of the first through hole 303C regulates the deformation. That is, the first through hole 303C which has the narrow part has a function of preventing the first through wiring 33C from being deviated with respect to the first through hole 303C. Since it is possible to prevent such a first through wiring 33C from being deformed, it is possible to further prevent the first through wiring 33C from being deviated with respect to the first through hole 303C. Note that, there is one narrowed part at the center in the first through hole 303C, but two or more narrowed parts may be formed.

Figure 13:
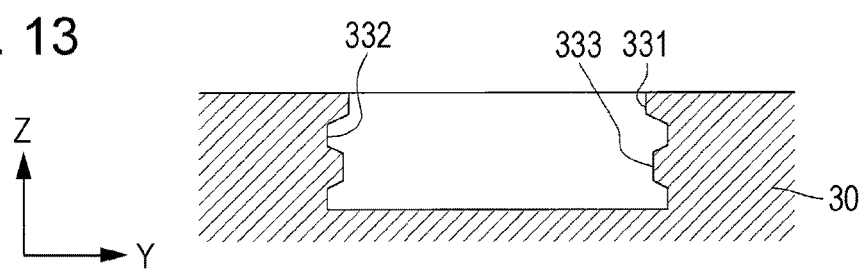
FIG. 13 is an enlarged sectional view of a main portion of the driving wiring substrate illustrating manufacturing steps of the first through hole.
Figure 14:
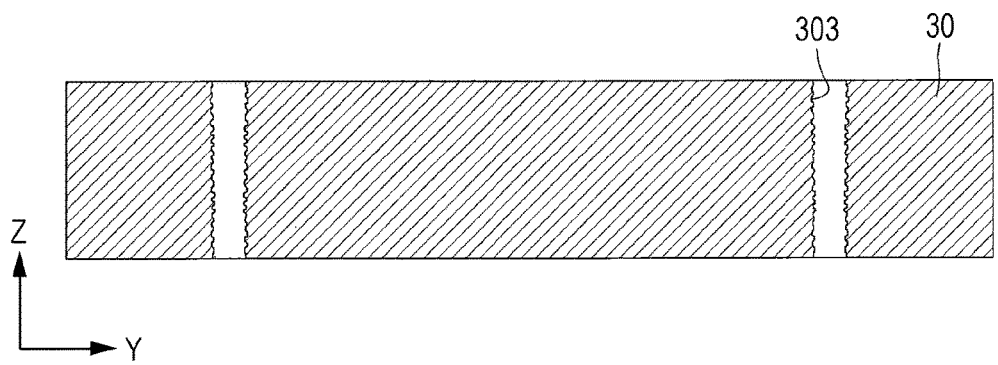
FIG. 14 is a sectional view of the driving wiring substrate illustrating manufacturing steps of a first through wiring.
Figure 15:
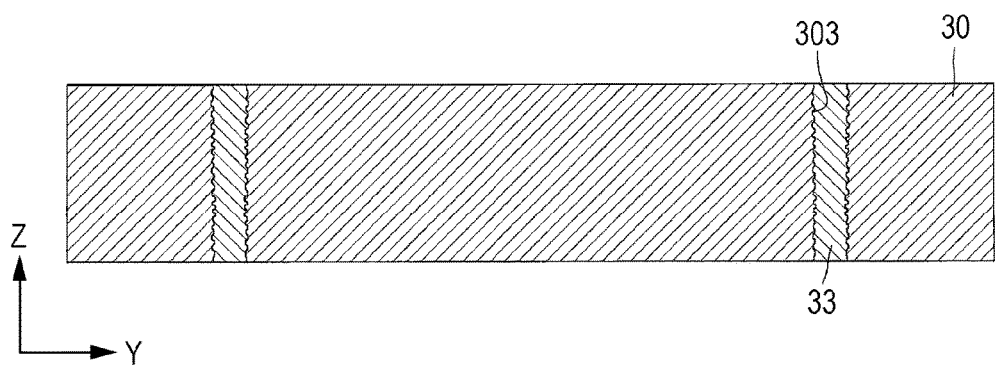
FIG. 15 is a sectional view of the driving wiring substrate illustrating manufacturing steps of the first through wiring.
Figure 16:
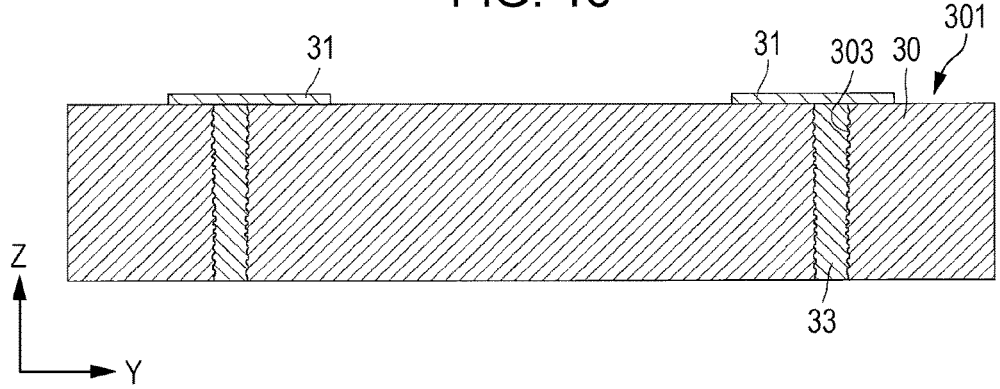
FIG. 16 is a sectional view of the driving wiring substrate illustrating manufacturing steps of the first through wiring.

A method of manufacturing the driving wiring substrate 30 will be described with reference to FIG. 10 to FIG. 16. FIG. 10 to FIG. 13 are sectional views in which a main portion of the driving wiring substrate illustrating a manufacturing steps of the first through hole is enlarged, and FIG. 14 to FIG. 16 are sectional views of the driving wiring substrate illustrating a manufacturing steps of the first through wiring.

In the embodiment, the plurality of driving wiring substrates 30 are collectively formed on the wafer for driving wiring substrate 130 which is a silicon wafer. The first through hole 303 is formed on the wafer for driving wiring substrate 130. The first through hole 303 is formed by using any one of an ICP method or a laser processing method, or using both methods. With this, it is possible to the first through hole 303 having a rough surface. Here, a case of using the laser processing method will be described.

Figure 10:
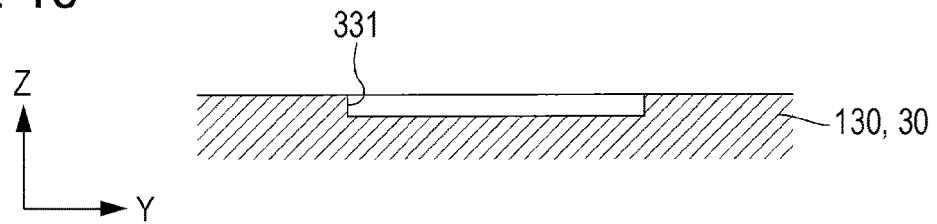
FIG. 10 is an enlarged sectional view of a main portion of the driving wiring substrate illustrating manufacturing steps of a first through hole.
Figure 11:
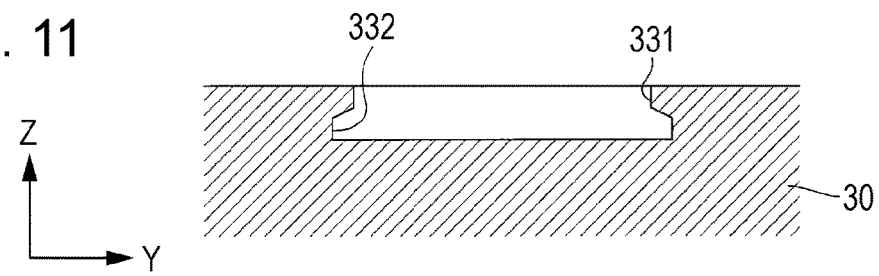
FIG. 11 is an enlarged sectional view of a main portion of the driving wiring substrate illustrating manufacturing steps of the first through hole.

First, as illustrated in FIG. 10, a first recessed portion 331 is formed by setting a specific output and focus and irradiating the wafer for driving wiring substrate 130 the laser. Then, as illustrated in FIG. 11, the first recessed portion 331 is further drilled by setting the output to be increased and focus to be deep as compared with those illustrated in FIG. 10, and irradiating the wafer for driving wiring substrate 130 with the laser. With the change of such a laser output, a second recessed portion 332 which is deeper than the first recessed portion 331 is formed.

Figure 12:
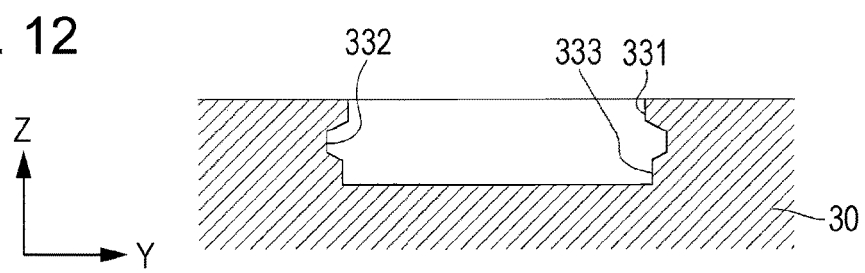
FIG. 12 is an enlarged sectional view of a main portion of the driving wiring substrate illustrating manufacturing steps of the first through hole.

Then, as illustrated in FIG. 12, the output is further changed, for example, the output is weakened, and further the focus is further deepened so as to irradiate the wafer for driving wiring substrate 130 with the laser, thereby further drilling the second recessed portion 332. With this, a third recessed portion 333 which is shallower than the second recessed portion 332 is formed. Further, as illustrated in FIG. 13, the focus is further deepened while increasing the output so as to irradiate the wafer for driving wiring substrate 130 with the laser.

In this way, when the focus is deepened while changing the output of the laser so as to drill the wafer for driving wiring substrate 130, it is possible to form the first through hole 303 of which the inner surface is a rough surface, as illustrated in FIG. 14. Similarly, it is possible to make the inner surface of the second through hole 305 a rough surface.

Next, as illustrated in FIG. 15, the first through wiring 33 formed of copper is formed in the first through hole 303 by using a plating method, for example.

Then, as illustrated in FIG. 16, the first individual wiring 31 is formed on the first main surface 301 of the wafer for driving wiring substrate 130. The first individual wiring 31 can be formed by using a sputtering method, for example. In addition, although not shown, the supply wiring 32 is formed in the same manner.

Hereinafter, although not particularly shown, the second individual wiring 35, the connection wiring 36, and a bump electrode 37 are formed on the second main surface 302 of the wafer for driving wiring substrate 130. In addition, the wafer for driving wiring substrate 130 is disconnected from the individual driving wiring substrate 130. In this way, it is possible to manufacture the driving wiring substrate 30 on which the first through wiring 33 and the second through wiring 34 are formed in the first through hole 303 and the second through hole 305 of which the inner surface becomes the rough surface.

Further, the first through hole 303A illustrated in FIG. 7 can be formed as follows. Although not particularly shown, a mask is formed on the wafer for driving circuit substrate. An opening portion of the mask is provided in an area in which the first through hole 303 is formed by patterning. Then, the wafer for driving circuit substrate is etched by using the ICP method so as to form the enlarged diameter portion 310 (refer to FIG. 7). The enlarged diameter portion 310 is provided on both surface of the wafer for driving circuit substrate.

Next, the first through hole 303A is formed by using a laser processing treatment. In detail, the laser processing treatment is performed in such a manner that the laser is directed to almost the center portion of the enlarged diameter portion 310, and as in the case illustrated in FIGS. 10 to 14, the focal point is deepened while changing the output of the laser. With this, it is possible to form the first through hole 303A which is provided with the enlarged diameter portion 310 having the rough surface of the shape illustrated in FIG. 7. In the same way, the second through hole 305 can be also formed.

The first through hole 303B illustrated in FIG. 8 can be formed as follows. Although not particularly shown, a mask is formed on the wafer for driving circuit substrate. An opening portion of the mask is provided in an area in which the first through hole 303 is formed by patterning. Then, the wafer for driving circuit substrate is etched by using an ICP method. At this time, it is possible to form the first through hole 303B having the rough surface by switching the etching step and the protection step in a relatively short time.

Further, the enlarged diameter portion 320 is formed at an arbitrary depth. The enlarged diameter portion 320 can be formed by taking a relatively long time for the etching step. Hereinafter, in a space in which the enlarged diameter portion 320 is not provided, the etching step and the protection step are switched to each other in a relatively short time as described above, and in the space in which the enlarged diameter portion 320 is provided, the etching step is performed in a relatively long time.

In this way, it is possible to form the first through hole 303B which has the rough surface of the shape illustrated in FIG. 8 and is provided with the enlarged diameter portion 320, by using an ICP method. In the same way, the second through hole 305 can be also formed.

Further, the first through hole 303C illustrated in FIG. 9 can be formed as follows. Although not particularly shown, a mask is formed on the wafer for driving circuit substrate. An opening portion of the mask is provided in an area in which the first through hole 303C is formed by patterning. Then, the wafer for driving circuit substrate is etched by using an ICP method. At this time, it is possible to form the rough surface by switching the etching step and the protection step in a relatively short time. Further, the etching is performed while adjusting the etching amount to the side in the etching step so that a narrow part in which the opening width of the center portion can be formed in a range from the first main surface 301 to the second main surface 302. In this way, it is possible to form the first through hole 303C which has the rough surface of the shape illustrated in FIG. 9 and has the narrow part, by using an ICP method. In the same way, the second through hole 305 can be also formed.

Other Embodiments

As described above, the respective embodiments of the invention are described; however, the basic configuration of the invention is not limited to the description as described above.

For example, the first individual wiring 31 and the second individual wiring 35 are formed as the surface wiring on the both surfaces of the driving wiring substrate 30, but are may be formed on one surface thereof. The configuration in which one side of the through wiring is connected to the surface wiring, and the outer side is directly connected to the terminal or the like of the driving circuit 120 is also included in the configuration of the wiring substrate of the invention.

In addition, the first through hole 303 and the second through hole 305 are exemplified as the through hole; however, the through hole is not limited thereto. The wiring substrate may have an arbitrary number and arrangement of the through holes.

Figure 17:
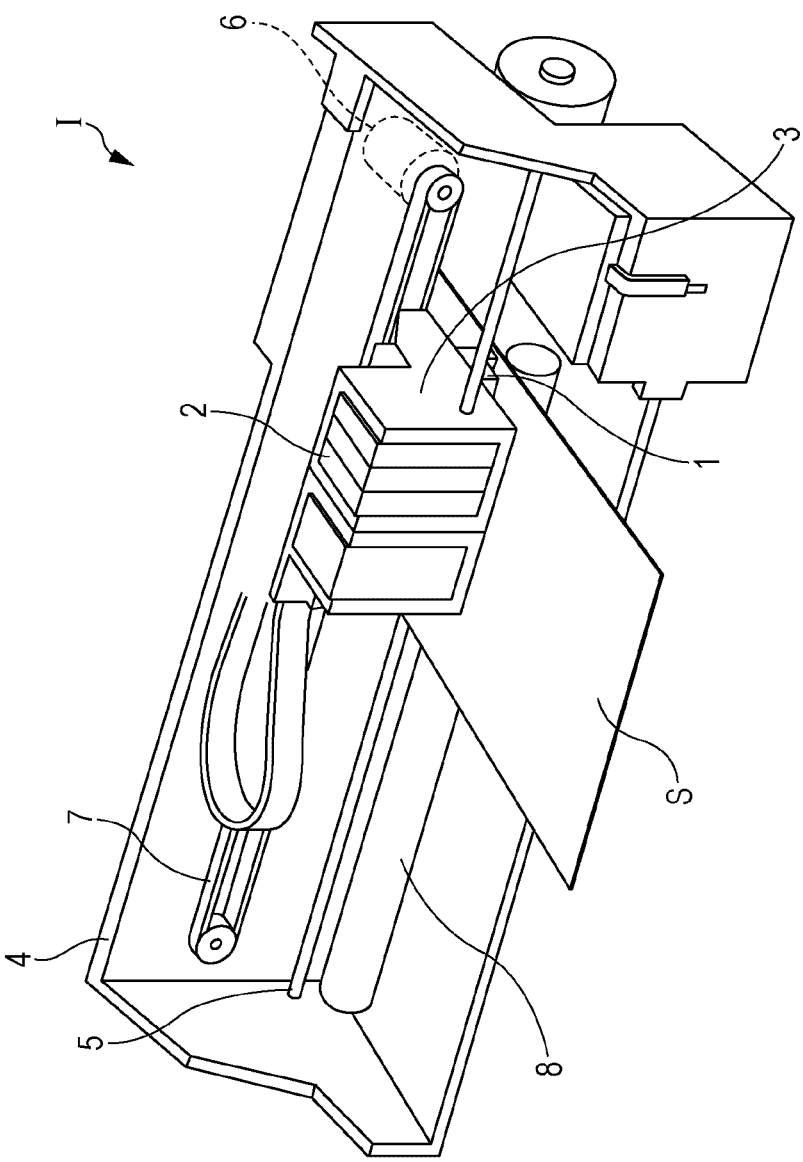
FIG. 17 is a schematic view of a recording apparatus according to one embodiment of the invention.

A recording head 1 in Embodiment 1 is mounted on an ink jet type recording apparatus which is an example of a liquid ejecting apparatus. FIG. 17 is a schematic view illustrating an example of an ink jet type recording apparatus.

In an ink jet type recording apparatus I, the recording head 1 is provided with a detachable cartridge 2 forming an ink supply unit, and a carriage 3 which is mounted on the recording head 1 is provided to be freely movable in the axial direction of a carriage axis 5 attached to an apparatus main body 4.

When a driving force of a driving motor 6 is transferred to the carriage 3 via a plurality of gears (not shown) and a timing belt 7, the carriage 3 mounted on the recording head 1 is moved along the carriage axis 5. On the other hand, a transporting roller 8 is provided in the apparatus main body 4 as a transporting unit, and a recording sheet S which is a recording medium such as a sheet is transported by the transporting roller 8. Meanwhile, the transporting unit that transports the recording sheet S may be a belt or a drum without being limited to the transporting roller.

Such an ink jet type recording apparatus I has the driving wiring substrate 30 described in Embodiment 1, and thus the reliability is improved.

In addition, in the above-described ink jet type recording apparatus I, the recording head 1 is mounted on the carriage 3 and moved in a main scanning direction; however, a configuration of the ink jet type recording apparatus I is not particularly limited thereto. For example, a so-called line-type recording apparatus, which performs printing such that the recording head 1 is fixed and the recording sheet S such as a sheet is moved in a sub scanning direction, is applicable to the invention.

In addition, in the above-described example, the ink jet type recording apparatus I has a configuration that the cartridge 2 which is a liquid storage portion is mounted on the carriage 3; however, a configuration of the ink jet type recording apparatus I is not particularly thereto. For example, a configuration such that the liquid storage portion such as an ink tank is fixed to the apparatus main body 4, and the liquid storage portion and the recording head 1 are connected to each other via a supply tube such as a tube may be employed. In addition, the liquid storage portion may not be mounted on the ink jet type recording apparatus.

Further, the invention relates to a broadly general head, for example, the invention is applicable to the recording head such as various types of ink jet type recording heads used in an image recording apparatus such as a printer; a color material ejecting head used for manufacturing a color filter such as a liquid crystal display; an electrode material ejecting head used for forming electrodes such as an organic EL display and a field emission display (FED); and a bioorganic material ejecting head used to manufacture a bio chip.

Further, the wiring substrate of the present invention is widely applied to a MEMS device, and can also be applied to a MEMS device other than a recording head. As the MEMS device, a device that detects a signal from the outside and changes the current value before and after detection can be exemplified. Examples of such a MEMS device include an ultrasonic device, a motor, a pressure sensor, a pyroelectric element, and a ferroelectric element. Further, a completed body using these MEMS devices, for example, a liquid ejecting apparatus using the aforementioned head, an ultrasonic sensor using the aforementioned ultrasonic device, a robot using the aforementioned motor as a driving source, an IR sensor using the aforementioned pyroelectric element, and a ferroelectric memory using the ferroelectric element are also included in MEMS devices. In the MEMS device, it is possible to detect a minute current by using the wiring substrate having the through wiring of the invention, in which the electric resistance is reduced. Further, in the MEMS device, disconnection of the surface wiring provided on the wiring substrate is suppressed, and thus the reliability is improved.

What is claimed is:

1. A wiring substrate comprising:
   a surface wiring at least one side surface;
   a through hole which passes through the wiring substrate; and
   a through wiring which is formed in the through hole, and is connected to the surface wiring,
   wherein an inner surface of the through hole is a rough surface, the inner surface being a surface of the wiring substrate, and
   wherein electric resistance of the through wiring is equal to or less than the electric resistance of the surface wiring.

2. The wiring substrate according to claim 1,
   wherein the inner surface of the through hole is the rough surface having an average surface roughness Ra in a range of 0.1 μm to 5.0 μm.

3. An MEMS device comprising the wiring substrate according to claim 2.

4. A liquid ejecting head comprising the wiring substrate according to claim 2.

5. A liquid ejecting apparatus comprising the liquid ejecting head according to claim 4.

6. The wiring substrate according to claim 1,
   wherein the through hole is provided with an enlarged diameter portion in which an opening on at least one side surface of the wiring substrate is enlarged in diameter, and
   wherein the through wiring includes an enlarged width portion which is provided in the enlarged diameter portion.

7. An MEMS device comprising the wiring substrate according to claim 6.

8. A liquid ejecting head comprising the wiring substrate according to claim 6.

9. A liquid ejecting apparatus comprising the liquid ejecting head according to claim 8.

10. The wiring substrate according to claim 1,
    wherein the through hole is provided with an enlarged diameter portion which is enlarged in an intermediate part, and
    wherein the through wiring includes an enlarged width portion which is provided in the enlarged diameter portion.

11. An MEMS device comprising the wiring substrate according to claim 10.

12. A liquid ejecting head comprising the wiring substrate according to claim 10.

13. A liquid ejecting apparatus comprising the liquid ejecting head according to claim 12.

14. The wiring substrate according to claim 1,
    wherein the through hole is formed such that an aperture on the intermediate part is narrower than an aperture of the opening side.

15. An MEMS device comprising the wiring substrate according to claim 14.

16. A liquid ejecting head comprising the wiring substrate according to claim 14.

17. A liquid ejecting apparatus comprising the liquid ejecting head according to claim 16.

18. An MEMS device comprising the wiring substrate according to claim 1.

19. A liquid ejecting head comprising the wiring substrate according to claim 1.

20. A liquid ejecting apparatus comprising the liquid ejecting head according to claim 19.

* * * * *